United States Patent
Son et al.

(10) Patent No.: US 9,004,971 B2
(45) Date of Patent: Apr. 14, 2015

(54) ORGANIC LUMINESCENCE DISPLAY DEVICE HAVING GETTER PATTERN AND METHOD OF MANUFACTURING THE SAME

(75) Inventors: Jung-Hyun Son, Yongin (KR); Hoon Kim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 263 days.

(21) Appl. No.: 13/244,158

(22) Filed: Sep. 23, 2011

(65) Prior Publication Data

US 2012/0169216 A1    Jul. 5, 2012

(30) Foreign Application Priority Data

Dec. 30, 2010    (KR) .................. 10-2010-0139341

(51) Int. Cl.
- *H01J 9/00*    (2006.01)
- *H01L 51/52*    (2006.01)
- *H01L 51/56*    (2006.01)
- *H01L 27/32*    (2006.01)

(52) U.S. Cl.
CPC ......... *H01L 51/5259* (2013.01); *H01L 27/3241* (2013.01); *H01L 51/56* (2013.01)

(58) Field of Classification Search
CPC ... H01L 51/5237; H01L 51/56; H01L 51/524; H01L 51/5246; H01L 51/0024; H01L 21/6835; H01J 7/183; H01J 29/94; C03C 8/24; C03C 27/06
USPC .................. 445/23–25; 313/498–512
See application file for complete search history.

(56) References Cited

U.S. PATENT DOCUMENTS

| | | | |
|---|---|---|---|
| 2008/0312072 A1 | 12/2008 | Vescovi et al. | |
| 2009/0058292 A1* | 3/2009 | Koo et al. | 313/512 |
| 2009/0065049 A1* | 3/2009 | Son et al. | 136/256 |
| 2010/0099323 A1* | 4/2010 | Zu et al. | 445/25 |

FOREIGN PATENT DOCUMENTS

| | | |
|---|---|---|
| JP | 2003-017243 | 1/2003 |
| KR | 1020050028560 A | 3/2005 |
| KR | 100659764 B1 | 12/2006 |
| KR | 10-2008-0090473 A | 10/2008 |
| KR | 1020080106648 A | 12/2008 |

* cited by examiner

*Primary Examiner* — Thomas A Hollweg
*Assistant Examiner* — Kevin Quarterman
(74) *Attorney, Agent, or Firm* — Knobbe Martens Olson & Bear LLP

(57) ABSTRACT

Provided is a method of manufacturing an organic luminescence display device, the method including: bringing a getter powder into direct contact with a first surface of an encapsulation substrate; irradiating a laser to a second surface of the encapsulation substrate correspondingly to a getter pattern area to melt the second surface of the encapsulation substrate; and bonding the getter powder to the molten second surface of the encapsulation substrate to form a getter pattern corresponding to the getter pattern area. Since the getter powder is directly bonded to the encapsulation substrate by laser irradiation, a fine getter pattern may be formed.

9 Claims, 7 Drawing Sheets

ORGANIC LUMINESCENCE DISPLAY DEVICE HAVING GETTER PATTERN AND METHOD OF MANUFACTURING THE SAME

CROSS-REFERENCE TO RELATED APPLICATION

This application claims the benefit of Korean Patent Application No. 10-2010-0139341, filed on Dec. 30, 2010, in the Korean Intellectual Property Office, the disclosure of which is incorporated herein in its entirety by reference.

BACKGROUND

1. Field

The present embodiments relate to an organic luminescence display device and a method of manufacturing the same, and more particularly, to an organic luminescence display device including an encapsulation substrate on which a getter pattern comprising getter powder is formed and a method of manufacturing the same.

2. Description of the Related Technology

Organic luminescence display devices include organic luminescence devices which are susceptible to water molecules and oxygen. When organic luminescence devices are exposed to water molecules and oxygen, their lifetimes are reduced. In detail, an organic layer included in an organic luminescence device deteriorates due to water molecules and oxygen and thus a panel has dark spots or pixel shrinkage occurs, thereby lowering the quality of the organic luminescence display device. To solve the problems, a getter is installed inside an organic luminescence display device to remove water molecules and oxygen from the organic luminescence display device.

However, due to the installation of the getter in an organic luminescence display device, a thickness and size of a panel are increased. In addition, a binder, which is used to form a getter, may cause a secondary contamination in the organic luminescence display device.

SUMMARY OF CERTAIN INVENTIVE ASPECTS

The present embodiments provide an organic luminescence display device having a fine getter pattern that does not include a binder to prevent a secondary contamination and a method of manufacturing the same.

According to an aspect of the present embodiments, there is provided a method of manufacturing an organic luminescence display device, in which the method includes: bringing a getter powder into direct contact with a first surface of an encapsulation substrate; irradiating a laser to a first surface of the encapsulation substrate correspondingly to a getter pattern area to melt the first surface of the encapsulation substrate; and bonding the getter powder to the molten first surface of the encapsulation substrate to form a getter pattern corresponding to the getter pattern area.

The method may further include: dividing an upper surface of a substrate into a pixel area and a getter pattern area; forming pixels in the pixel area; coating a sealant at an edge of the first surface of the encapsulation substrate on which the getter pattern is formed; and bonding the substrate to the encapsulation substrate while the upper surface of the substrate faces the first surface of the encapsulation substrate.

In the bonding of the substrate to the encapsulation substrate, the pixel area of the substrate and the getter pattern formed on the encapsulation substrate do not overlap each other.

The pixel area is formed in a matrix shape, and the getter pattern area is formed in a lattice pattern, surrounding the pixel area.

In the bringing of the getter powder into direct contact with the first surface of the encapsulation substrate, the first surface of the encapsulation substrate is disposed downward in the gravitational direction and the getter powder is disposed under the first surface of the encapsulation substrate.

A laser irradiation temperature is higher than a melting point of the encapsulation substrate and lower than a melting point of the getter powder.

The getter pattern is a single layer comprising getter powder.

A width of the getter pattern may be dependent upon a width of the irradiated laser.

The method may further include maintaining the contact of the getter powder and the first surface of the encapsulation substrate during when the getter pattern is formed on the encapsulation substrate, and after the getter pattern is formed, removing a getter powder that contacts a portion of the first surface of the encapsulation substrate on which the getter pattern is not formed.

The getter powder may be directly attached to the first surface of the encapsulation substrate without a separate adhesive.

According to an aspect of the present embodiments, there is provided an organic luminescence display device including: a substrate having a pixel area and a getter pattern area; pixels formed in the pixel area; an encapsulation substrate bonded to the substrate; and a getter pattern formed directly on the encapsulation substrate, corresponding to the getter pattern area, wherein the getter pattern includes a getter powder.

The organic luminescence display device may further include a sealant which is formed at an edge of the encapsulation substrate and with which the substrate is bonded to encapsulation substrate.

The pixel area of the substrate and the getter pattern formed on the encapsulation substrate do not overlap each other.

The pixel area is formed in a matrix shape, and the getter pattern area is formed in a lattice pattern, surrounding the pixel area.

A height of the getter pattern may be dependent upon a diameter of the getter powder.

The getter powder may be directly attached to the encapsulation substrate without a binder.

BRIEF DESCRIPTION OF THE DRAWINGS

The above and other features and advantages of the present embodiments will become more apparent by describing in detail example embodiments thereof with reference to the attached drawings in which.

DETAILED DESCRIPTION OF CERTAIN INVENTIVE EMBODIMENTS

Figure 1:
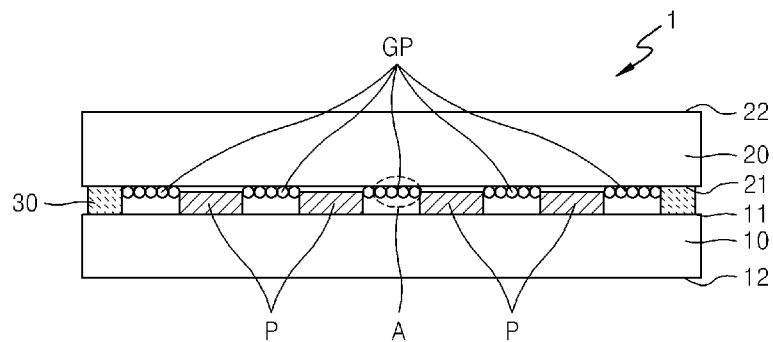
FIG. 1 is a cross-sectional schematic view of an organic luminescence display device according to an embodiment.

Reference will now be made in detail to embodiments, examples of which are illustrated in the accompanying drawings. In this regard, the present embodiments may have different forms and should not be construed as being limited to the descriptions set forth herein. Accordingly, the embodiments are merely described below, by referring to the figures, to explain aspects of the present description.

It will be understood that, although the terms first, second, third, etc., may be used herein to describe various elements, these elements should not be limited by these terms. These terms are only used to distinguish one element from another element.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "includes," when used in this specification, specify the presence of stated features, integers, steps, operations, elements, and/or components, but do not preclude the presence or addition of one or more other features, integers, steps, operations, elements, components, and/or groups thereof.

Hereinafter, one or more embodiments of an organic light-emitting display device according to the present embodiments will be described in detail with reference to the drawings. In the drawings, like reference numerals denote the same or corresponding elements, and the same description will not be presented.

Figure 2:
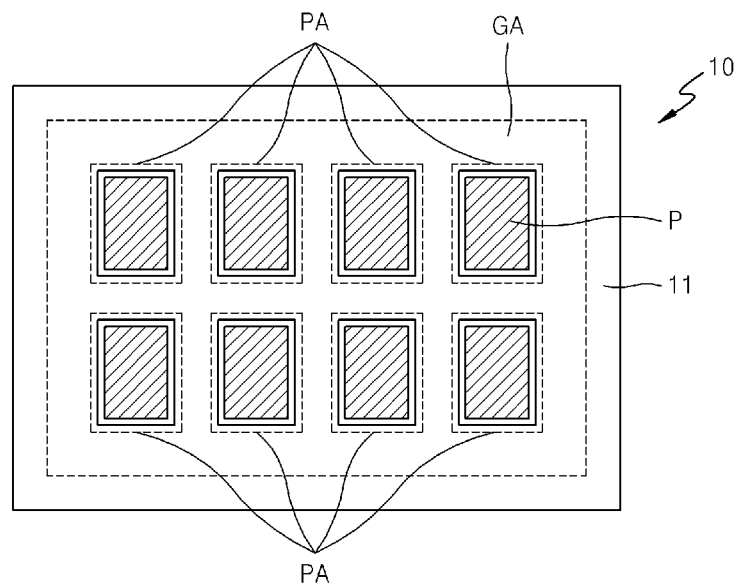
FIG. 2 is a schematic view of a substrate of the organic luminescence display device of FIG. 1.
Figure 3:
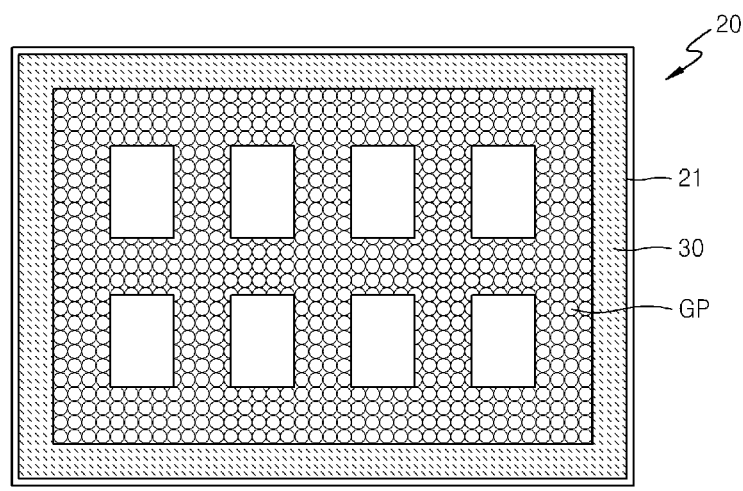
FIG. 3 is a schematic view of an encapsulation substrate of the organic luminescence display device of FIG. 1.

FIG. 1 is a cross-sectional schematic view of an organic luminescence display device 1 according to an embodiment. FIG. 2 is a schematic view of a substrate 10 of the organic luminescence display device 1 of FIG. 1. FIG. 3 is a schematic view of an encapsulation substrate 20 of the organic luminescence display device 1 of FIG. 1.

The organic luminescence display device 1 includes the substrate 10 and the encapsulation substrate 20, and the substrate 10 is bonded to the encapsulation substrate 20 with a sealant 30.

The substrate 10 has an upper surface 11 that has a pixel area PA and a getter pattern area GA. The pixel area PA is formed in a matrix form. Pixels P are formed spaced apart from each other at constant intervals. The substrate 10 also has a lower surface 12.

The pixels P are formed in the pixel area PA, and each of the pixels P includes a circuit unit (not shown) and a luminescence unit (not shown). The circuit unit includes a plurality of transistors and capacitors for driving the luminescence unit. The luminescence unit is electrically connected to the circuit unit and includes an organic luminescence device for emitting light. The organic luminescence device includes a first electrode, a light-emitting member, and a second electrode.

The first electrode may function as an anode and the second electrode may function as a cathode. Alternatively, the first electrode may function as a cathode and the second electrode may function as an anode.

If the organic luminescence display device 1 is a bottom emission type device and thus an image is formed toward the substrate 10, the first electrode may be a transparent electrode and the second electrode may be a reflective electrode. In this case, the first electrode may comprise a high work function material, such as ITO, IZO, ZnO, or $In_2O_3$, and the second electrode may comprise a low work function material, such as Ag, Mg, Al, Pt, Pd, Au, Ni, Nd, Ir, Cr, Li, or Ca.

If the organic luminescence display device 1 is a top emission type device and thus an image is formed toward the second electrode, the first electrode may be a reflective electrode and the second electrode may be a transparent electrode. In this case, the reflective electrode, which is the first electrode, may include a reflective film comprising Ag, Mg, Al, Pt, Pd, Au, Ni, Nd, Ir, Cr, Li, Ca, or a mixture thereof and a film comprising a high work function material, such as ITO, IZO, ZnO, or $In_2O_3$. Also, the transparent electrode, which is the second electrode, may be formed by depositing a low work function metal, such as Ag, Mg, Al, Pt, Pd, Au, Ni, Nd, Ir, Cr, Li, Ca, or a mixture thereof, and forming thereon an auxiliary electrode layer or a bus electrode line comprising a transparent conductive material, such as ITO, IZO, ZnO, or $In_2O_3$.

If the organic luminescence display device 1 is a bi-directional emission type device, the first electrode and the second electrode may both be a transparent electrode.

The light-emitting member may be formed between the first electrode and the second electrode, and may include a hole injection layer (HIL), a hole transport layer (HTL), an emission layer (EML), an electron transport layer (ETL), an electron injection layer (EIL), etc. Each of the layers may be a single layer or may have a multi-layer structure. In this case, the HIL, the HTL, the ETL, and the EIL are common layers of all pixels P. However, the EML may differ among a red pixel, a blue pixel, and a green pixel.

The getter pattern area GA may surround the pixel area PA and may be formed in a lattice pattern. The getter pattern area GA may surround the pixel areas PA spaced apart from each other at constant intervals. The getter pattern area GA may correspond to a getter pattern GP formed on the encapsulation substrate 20.

The encapsulation substrate 20 has a first surface 21 on which the getter pattern GP is formed corresponding to the getter pattern area GA of the substrate 10. Accordingly, the getter pattern GP may be formed in the same lattice pattern as the getter pattern area GA. When the substrate 10 is bonded to the encapsulation substrate 20, a getter is located between adjacent pixels P. The pixel area PA of the substrate 10 and the getter pattern GP of the encapsulation substrate 20 do not overlap each other. Thus, the getter pattern GP is formed to be present between adjacent pixels P so as to efficiently protect the pixels P from external water molecules and impurities. The getter pattern GP will be described below in detail with reference to FIG. 4.

The sealant 30 is disposed at edges of the first surface 21 of the encapsulation substrate 20. The sealant 30 is disposed on a junction area corresponding to the outermost portion of the getter pattern area GA of the substrate 10. In FIG. 3, the sealant 30 is formed on the encapsulation substrate 20. However, the location of the sealant 30 is not limited thereto. For example, the sealant 30 is instead formed on the substrate 10. In this regard, the sealant 30 may include a thermally curable material or a photo curable material.

Figure 4:
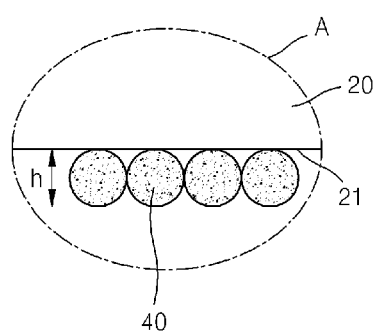
FIG. 4 is an enlarged view of a portion A of FIG. 1.

FIG. 4 is an enlarged view of a portion A of FIG. 1.

Referring to FIG. 4, the getter pattern GP may be formed by irradiating a laser to a getter powder 40 to directly attach the getter powder 40 to the first surface 21 of the encapsulation substrate 20. Since the getter powder 40 is attached to the encapsulation substrate 20 by melting a surface of the encapsulation substrate 20 that contacts the getter powder 40 due to the laser irradiation, the getter pattern GP is formed as a single layer comprising the getter powder 40. Also, since the getter pattern GP is formed as a single layer comprising the getter powder 40, a height h of the getter pattern GP may be dependent upon a diameter of the getter powder 40.

In this case, the getter powder 40 may include microparticles of a desiccant and a getter, and an average diameter of the microparticles of the getter powder 40 may be about 2 um. In addition, the getter powder 40 may be a loose powder in which individual particles move independently.

A getter is a material that prevents a decrease in lifetime of an organic luminescence device due to a reaction between the organic luminescence device and water molecules and oxygen. The getter may include Group II metal, metal oxide, or a mixture thereof. For example, the getter may include at least one material selected from the group consisting of calcium (Ca), barium (Ba), calcium oxide (CaO), and barium oxide (BaO). The getter may be prepared in a curable paste form, may be used together with a binder, such as acrylate, polysiloxane, polyurethane, or melamine, or may be prepared in a powder form and used together with an adhesive.

However, if a getter is prepared in a curable paste form, processing costs are high and processing time is long since coating with the paste needs to be performed in a vacuum condition. In addition, since the coating with the paste is performed by dispensing or screen-printing, a coating margin needs to be secured. Accordingly, there is a limit in manufacturing a fine getter line. Also, if a getter is used together with a binder, an inside of the organic luminescence display device may be secondarily contaminated due to gas generated from the binder. Also, if a getter is prepared in a powder form and then used together with an adhesive, an inside of the organic luminescence display device may be secondarily contaminated due to gas trapped in pores of the adhesive.

Accordingly, according to an embodiment, since the getter powder 40 directly contacts the encapsulation substrate 20 without a separate adhesive member, the getter pattern GP does not need a coating margin required in conventional attaching methods, enabling formation of a fine getter line. In addition, since a separate adhesive member, such as a binder or an adhesive, is not used, the secondary contamination does not occur in the inside of the organic luminescence display device 1.

FIGS. 5 through 8 are views for explaining a method of manufacturing the organic luminescence display device 1, according to an embodiment.

Figure 5:
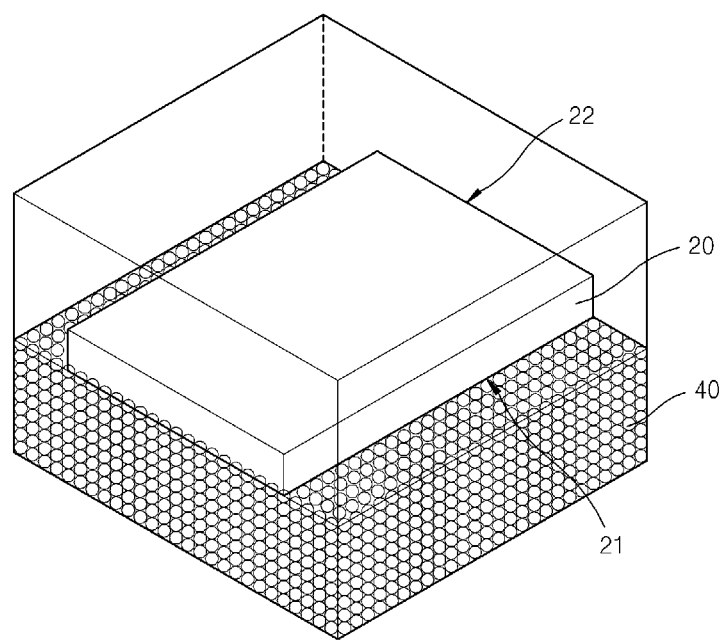
FIGS. 5 through 8 are views for explaining a method of manufacturing an organic luminescence display device, according to an embodiment.

Referring to FIG. 5, the first surface 21 of the encapsulation substrate 20 is brought into contact with the getter powder 40. The getter powder 40 may be contained in a vessel that has an open upper portion and is suitable for housing the encapsulation substrate 20. As described above, the getter powder 40 is a loose powder and may include at least one material selected from the group consisting of calcium (Ca), barium (Ba), calcium oxide (CaO), and barium oxide (BaO).

When the first surface 21 of the encapsulation substrate 20 is brought into contact with the getter powder 40, the first surface 21 of the encapsulation substrate 20 is disposed to face downward in the gravitational direction and the getter powder 40 contained in the vessel is disposed under the first surface 21 of the encapsulation substrate 20. Due to the weight of the encapsulation substrate 20, the getter powder 40 contacts the first surface 21 of the encapsulation substrate 20.

Figure 6A:
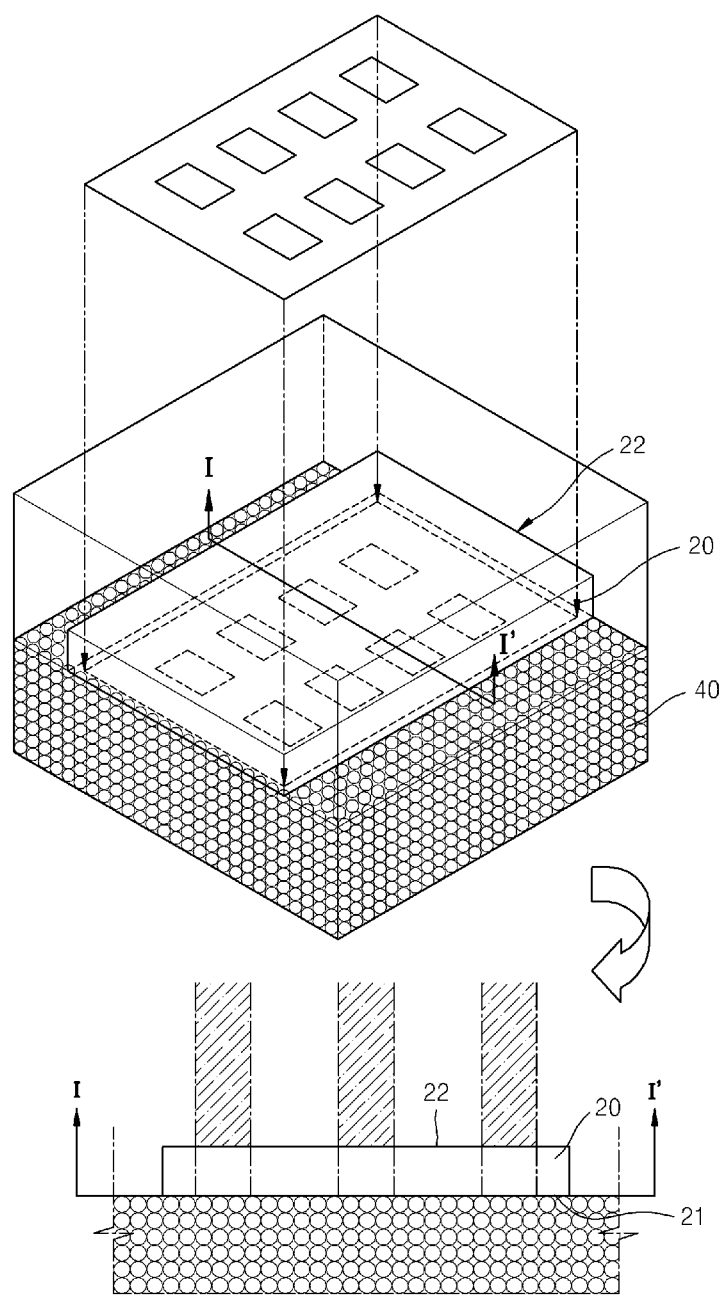
Figure 6B:
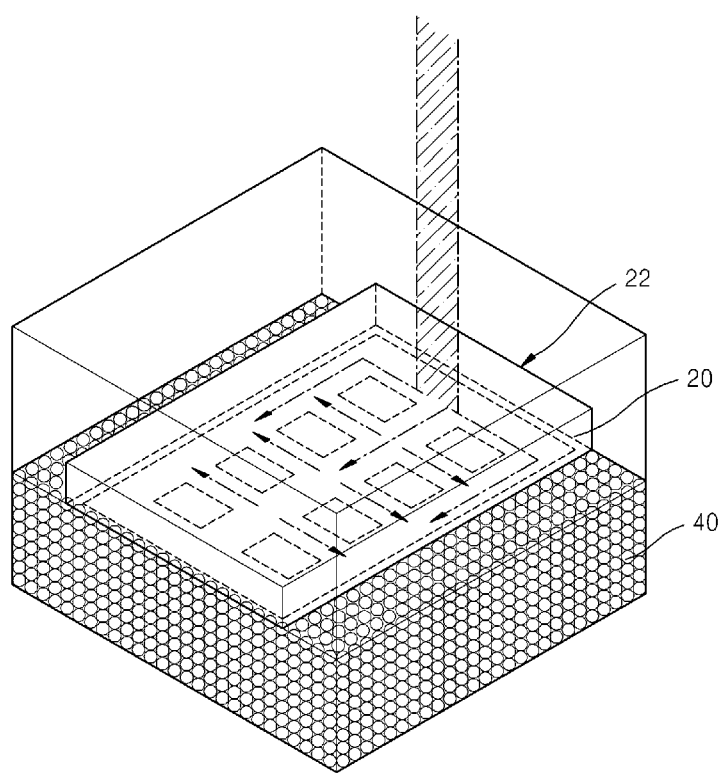

Referring to FIGS. 6A and 6B, a laser is irradiated to the first surface 22 of the encapsulation substrate 20. In this case, a laser is irradiated corresponding to the getter pattern area GA of the substrate 10. Referring to FIG. 6A, an area laser is irradiated. When the area laser passes a mask, the laser on the first surface of 22 of the encapsulation substrate 20 has a shape corresponding to the getter pattern area GA. However, the present embodiments are not limited thereto, and as illustrated in FIG. 6B, a spot laser or a line-shaped laser may be irradiated while moving corresponding to the shape of the getter pattern area GA. If the laser is irradiated as illustrated in FIG. 6A, processing time is reduced and a laser may be irradiated to the getter pattern area GA with a constant power. Also, if the laser is irradiated as illustrated in FIG. 6B, manufacturing costs may be reduced since manufacturing of a mask is not needed, and a fine pattern may be easily formed.

During when the laser is irradiated to form the getter pattern GP, the first surface 21 of the encapsulation substrate 20 and the getter powder 40 needs to contact each other continuously. By doing so, a shape comprising the getter powder 40 corresponds to the getter pattern GP. If the encapsulation substrate 20 is elevated from the getter powder 40 during the laser irradiation on the getter pattern GP, the getter powder 40 may be incompletely attached to the first surface 21 of the encapsulation substrate 20 and thus, the uniformity of the getter pattern GP may be reduced.

Figure 7:
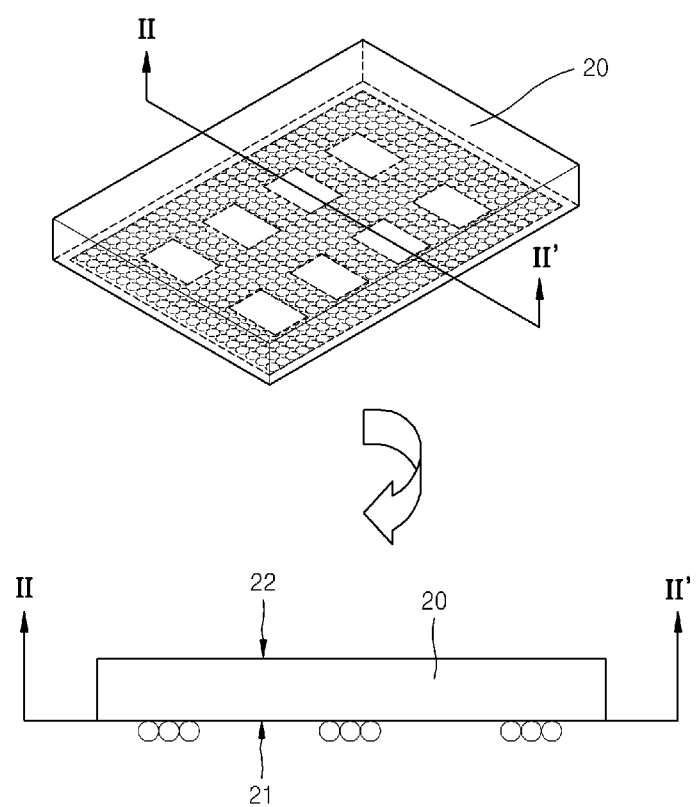

Referring to the perspective view and the cross-sectional view of FIG. 7, due to the irradiation of a laser, the first surface 22 of the encapsulation substrate 20 melts so that the getter powder 40 is bonded to the encapsulation substrate 20, thereby forming the getter pattern GP corresponding to the getter pattern area GA. In this case, a laser irradiation temperature may be higher than a melting point of the encapsulation substrate 20 and lower than a melting point of the getter powder 40. If the laser irradiation temperature satisfies the temperature condition described above, the encapsulation substrate 20 melts by laser irradiation and the getter powder 40 is bonded to the molten encapsulation substrate 20, and also, the getter powder 40 bonded to the encapsulation substrate 20 is not damaged by the laser. Also, the laser irradiation temperature may be higher than a softening point of the encapsulation substrate 20.

In addition, since the laser irradiation temperature is controlled to be higher than a melting point of the encapsulation substrate 20 and lower than a melting point of the getter powder 40, the getter powder 40 attached to the encapsulation substrate 20 may be form as a single layer. If the laser irradiation temperature is lower than the melting point of the encapsulation substrate 20, the getter powder 40 may not attach to the encapsulation substrate 20. On the other hand, if the laser irradiation temperature is higher than the melting point of the getter powder 40, the getter powder 40 may melt and agglomerate together and the agglomerated getter powder 40 attaches to the encapsulation substrate 20. Thus, the formed getter pattern GP may not have a uniform height and width.

Also, a width of the getter pattern GP may be dependent on a width of the irradiated laser. Accordingly, according to an embodiment, a fine getter pattern may be manufactured by controlling the laser width. For example, a width of the getter pattern GP may be about 10 um. By forming a fine getter pattern, the organic luminescence display device 1 is manufactured as a small and thin device.

Furthermore, after the encapsulation substrate 20 is molten by the laser irradiation and a getter pattern GP is formed thereon, the resultant structure may be left to cool for a predetermined time period so as to solidify the molten encapsulation substrate 20.

In detail, after the getter pattern GP is formed, a getter powder that contacts a portion of the first surface 21 of the encapsulation substrate 20 on which the getter pattern GP is not formed is removed. First, the encapsulation substrate 20 is elevated from the vessel containing the getter powder 40. Then, additionally, the encapsulation substrate 20 may be shaken, or absorption may be performed on the first surface 21 of the encapsulation substrate 20, or an inert gas may be strongly blown on the first surface 21 of the encapsulation substrate 20 so as to remove the getter powder that contacts a portion of the first surface 21 of the encapsulation substrate 20 on which the getter pattern GP is not formed. If a getter powder remains in a portion of the substrate 10 that does not correspond to the getter pattern area GA when the substrate 10 is bonded to the encapsulation substrate 20, the getter powder may act as an impurity to a pixel P.

Figure 8:
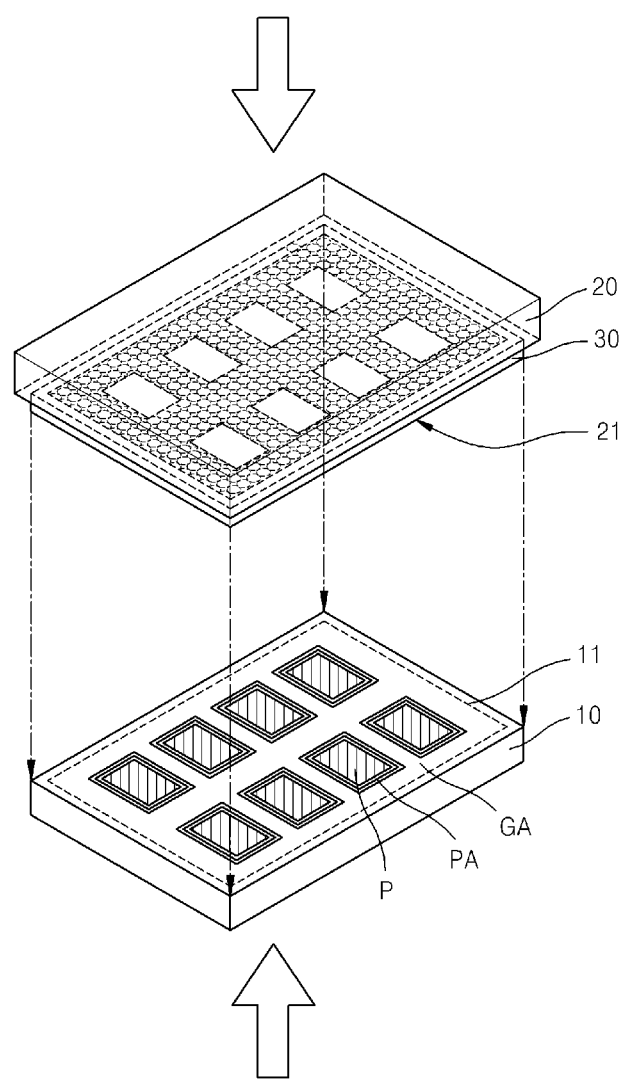

Referring to FIG. 8, the upper surface 11 of the substrate 10 is divided into the pixel area PA and the getter pattern area GA. Then, the pixels P are formed in the pixel areas PA. Since the pixel P has been described above, the pixel P will not be described in detail herein.

Then, the sealant 30 is coated on the edge of the first surface 21 of the encapsulation substrate 20 on which the getter pattern GP of FIG. 7 is formed.

As illustrated in FIG. 8, the upper surface 11 of the substrate 10 is disposed to face the first surface 21 of the encapsulation substrate 20 and in this state, the substrate 10 is bonded to the encapsulation substrate 20 with the sealant 30. In this case, the pixel area PA of the substrate 10 and the getter pattern GP of the encapsulation substrate 20 do not overlap each other. In the organic luminescence display device 1 formed as described above, the getter pattern GP surrounds the pixels P so that deterioration of an organic luminescence device (not shown) included in a pixel P may be effectively prevented.

While the present embodiments have been particularly shown and described with reference to example embodiments thereof, it will be understood by those of ordinary skill in the art that various changes in form and details may be made therein without departing from the spirit and scope of the present embodiments as defined by the following claims.

What is claimed is:

1. A method of manufacturing an organic luminescence display device, the method comprising:
    contacting a binder-free getter powder with an entire first surface of an encapsulation substrate;
    irradiating a laser to a second surface of the encapsulation substrate correspondingly to a first getter pattern area sufficiently to melt the first surface of the encapsulation substrate while maintaining the contact of the getter powder and the entire first surface of the encapsulation substrate;
    bonding the binder-free getter powder to the molten first surface of the encapsulation substrate to form a getter pattern corresponding to the first getter pattern area; and
    removing the getter powder that contacts a portion of the first surface of the encapsulation substrate on which the getter pattern is not formed.

2. The method of claim 1, further comprising:
    dividing an upper surface of a substrate into a plurality of pixel areas and a second getter pattern area surrounding each of the plurality of pixel areas;
    forming pixels in the plurality of pixel areas;
    coating a sealant at an edge of the first surface of the encapsulation substrate on which the getter pattern is formed; and
    bonding the substrate to the encapsulation substrate while the upper surface of the substrate faces the first surface of the encapsulation substrate;
    wherein the getter pattern on the first surface of the encapsulation substrate does not contact the upper surface of the substrate.

3. The method of claim 2, wherein in the bonding of the substrate to the encapsulation substrate, the plurality of pixel areas of the substrate and the getter pattern formed on the encapsulation substrate do not overlap each other, and wherein the first getter pattern area substantially corresponds to the second getter pattern area.

4. The method of claim 2, wherein the plurality of pixel areas are formed in a matrix shape, and the second getter pattern area has a shape of a lattice pattern, surrounding the plurality of pixel areas.

5. The method of claim 1, wherein in the contacting of the getter powder with the first surface of the encapsulation substrate, the first surface of the encapsulation substrate is disposed downward in the gravitational direction and the getter powder is disposed under the first surface of the encapsulation substrate.

6. The method of claim 1, wherein the laser irradiation temperature is higher than the melting point of the encapsulation substrate and lower than a melting point of the getter powder.

7. The method of claim 1, wherein the getter pattern is a single layer comprising getter powder.

8. The method of claim 1, wherein the width of the getter pattern is dependent upon the width of the irradiated laser.

9. The method of claim 1, wherein the getter powder is directly attached to the first surface of the encapsulation substrate without a separate adhesive.

* * * * *